United States Patent
Ruppert

(10) Patent No.: US 12,510,568 B2
(45) Date of Patent: Dec. 30, 2025

(54) METHOD FOR DETERMINING A CURRENT FLOWING THROUGH AT LEAST ONE SWITCHING ELEMENT, ELECTRICAL CIRCUIT ARRANGEMENT, AND MOTOR VEHICLE

(71) Applicant: AUDI AG, Ingolstadt (DE)

(72) Inventor: Daniel Ruppert, Lenting (DE)

(73) Assignee: Audi AG, Ingolstadt (DE)

( * ) Notice: Subject to any disclaimer, the term of this patent is extended or adjusted under 35 U.S.C. 154(b) by 668 days.

(21) Appl. No.: 17/824,777

(22) Filed: May 25, 2022

(65) Prior Publication Data

US 2022/0381806 A1 Dec. 1, 2022

(30) Foreign Application Priority Data

May 26, 2021 (DE) .......................... 102021113493.5

(51) Int. Cl.
| | | |
|---|---|---|
| *G01R 19/165* | (2006.01) | |
| *G01D 21/02* | (2006.01) | |
| *G01R 19/00* | (2006.01) | |
| *G01R 19/25* | (2006.01) | |
| *H01L 23/34* | (2006.01) | |

(Continued)

(52) U.S. Cl.
CPC ....... *G01R 19/16528* (2013.01); *G01D 21/02* (2013.01); *G01R 19/0069* (2013.01); *G01R 19/0092* (2013.01); *G01R 19/25* (2013.01); *H01L 23/34* (2013.01); *H02M 1/32* (2013.01); *H03K 17/08122* (2013.01)

(58) Field of Classification Search
CPC .......... G01R 19/16528; G01R 19/0069; G01D 21/02; H03K 2217/0027
See application file for complete search history.

(56) References Cited

U.S. PATENT DOCUMENTS

| | | | | |
|---|---|---|---|---|
| 11,114,947 B2 * | 9/2021 | Telefus | ................... | H05B 47/10 |
| 2006/0103409 A1 * | 5/2006 | Shigeta | ................... | G01R 19/32 |
| | | | | 324/750.03 |
| 2010/0327837 A1 | 12/2010 | Tsugawa et al. | | |

(Continued)

FOREIGN PATENT DOCUMENTS

| | | |
|---|---|---|
| DE | 102017204052 A1 | 9/2018 |
| DE | 102017211045 A1 | 1/2019 |

(Continued)

OTHER PUBLICATIONS

WO2016046021A1 Machine Translation (Year: 2016).*

*Primary Examiner* — Ricky Go
(74) *Attorney, Agent, or Firm* — Seed Intellectual Property Law Group LLP

(57) ABSTRACT

A method determines a current flowing through at least one switching element of an electrical circuit arrangement. When the switching element is turned on the current flows through a switchable portion of the switching element. The switching element is associated with a temperature sensor and a voltage sensor. The temperature sensor measures a temperature of the switching element and the voltage sensor measures a voltage drop across the switchable portion of the switching element. The temperature sensor and the voltage sensor are connected to a computing device. The computing device determines a current value of the current based on the measured temperature and the measured voltage drop.

12 Claims, 2 Drawing Sheets

(51) Int. Cl.
*H02M 1/32* (2007.01)
*H03K 17/0812* (2006.01)

(56) References Cited

U.S. PATENT DOCUMENTS

2019/0250046 A1 8/2019 Sun et al.
2020/0112245 A1 4/2020 Mitsui et al.
2021/0313922 A1* 10/2021 Hirakata ................ H02P 27/08

FOREIGN PATENT DOCUMENTS

JP 2020-72569 A 5/2020
WO WO-2016046021 A1 * 3/2016 .............. H02M 1/32

* cited by examiner

METHOD FOR DETERMINING A CURRENT FLOWING THROUGH AT LEAST ONE SWITCHING ELEMENT, ELECTRICAL CIRCUIT ARRANGEMENT, AND MOTOR VEHICLE

BACKGROUND

Technical Field

The present disclosure relates to a method for determining a current flowing through at least one switching element of an electrical circuit arrangement, wherein the current when the switching element is turned on flows through a switchable portion of the switching element. Moreover, the present disclosure relates to an electrical circuit arrangement and a motor vehicle.

Description of the Related Art

Motor vehicles with an electrical traction drive generally include a traction converter or a drive inverter, which transforms a direct current provided from a traction energy accumulator of the motor vehicle, such as a high-voltage battery, into an alternating current for the operation of an electrical traction motor. The phase currents of the alternating current play an important role in the operation of the traction converter, since they are directly responsible for the formation of the torque in the electric machine. The phase currents are controlled variables which go directly into a close-loop control of the electric machine. It is thus beneficial to ascertain the phase currents precisely, in order to prevent the occurrence of torque fluctuations, since these may be detrimental to the operation of an electric machine and also especially to the driving operation of a motor vehicle.

In order to measure the phase currents particularly in traction converters, it is known how to install current sensors for the phase current determination. One known possibility, for example, is to use Hall-effect sensors, by which the phase currents can be detected through a change in the magnetic field surrounding a conductor carrying the phase current. Furthermore, it is known that the temperatures of the switching elements of a converter can also be ascertained with the aid of the measured phase currents, in order to monitor the heating of the switching elements.

In US 2020/0112245 A1, a three-phase converter is described, the operation of which is regulated by a control unit. An overheating protection device evaluates the current strengths of the phase currents used for the regulation by the control device and drain-source voltages of the switching elements measured by the overheating protection device, in order to determine a temperature-dependent resistance of the switching element. The temperature determined from the resistance is compared to a limit value in order to ascertain whether an overheating of the switching element is present.

JP 2020072569 A describes a method for measuring the temperature of a semiconductor switching element based on a time change in a gate voltage of the switching element and without the use of a temperature sensor. A load current of the switching element is determined through a current sensor. After this, the temperature of the semiconductor element is computed from likewise measured and recorded values of a gate voltage of the switching element and the measured current values.

In US 2019/0250046 A1, a three-phase inverter is described, in which the generated phase currents are each measured through a Hall sensor. A temperature of the semiconductor component is then ascertained from the measured load current and a voltage change found in an output voltage of the switching element.

BRIEF SUMMARY

One embodiment is an improved method for determining a current flowing through a switching element, which works in particular without the use of current sensors.

The switching element is associated with a temperature sensor and a voltage sensor, wherein the temperature sensor measures a temperature of the switching element and the voltage sensor measures a voltage drop across the switchable portion of the switching element, wherein the temperature sensor and the voltage sensor are connected to a computing device and the computing device determines a current value of the current from a temperature measured value of the temperature sensor describing the temperature of the switching element and a voltage measured value of the voltage sensor describing the voltage across the switchable portion.

A method according to one embodiment has the advantage that no current sensors are utilized to measure the current value of the current flowing in the On condition of the switching element, i.e., a load current flowing through the switching element. The electrical resistance of the switchable portion of the switching element in the On condition can be determined from the temperature of the switching element as determined by the temperature sensor, for example with the aid of a value mapping instruction embedded in the computing device, such as a table or a calculation instruction. The current flowing through the switching element can be determined from the measured temperature or the resistance of the switchable portion and the voltage drop across the switchable portion as measured by the voltage sensor. Depending on the design of the switching element, the switchable portion may be for example a collector-emitter section or a drain-source section of the switching element.

The switching element may be switched in particular periodically between an On condition and an Off condition during the operation of the electrical circuit arrangement, and the load current flowing through the switchable portion is determined by the method in the On condition. The temperature measurement is used to determine a value of the electrical resistance of the switchable portion, i.e., a channel resistance of the switching element.

The electrical resistance of the switchable portion can be viewed here as a shunt and used for the current measurement through the components. Since this electrical resistance is dependent on the temperature, the actual resistance value of the switchable portion of the switching element can be ascertained by the temperature measurement, possibly taking into account an embedded mapping instruction. From this, with the aid of a voltage measured value of the voltage drop across this resistance, recorded in particular at the same time as the temperature measured value, the current flowing through the switchable portion of the switching element can be determined.

A method according to one embodiment has the advantage that one can avoid large manufacturing costs in the manufacture of the electrical circuit arrangement, since no costly current sensors are installed. Thus, advantageously, one can do without the use of Hall sensors and/or a shunt measurement circuit, or further evaluation and filter circuits. In particular, in an electrical circuit arrangement which is designed as a multiphase inverter, many such current sensors would be used to detect the phase currents, so that the method can be used with special advantage in multiphase inverters. The construction of the electrical circuit arrangement is also simplified, since one can do without costly and bulky connections such as bus bars between the current sensors and also connections and current sensors.

The elimination of these components furthermore makes possible a better connecting of the switching element to a cooling device, since more design space is available for a possibly extensive contact between the at least one switching element and a heat sink. Moreover, the installation and fastening of the electrical circuit arrangement are facilitated. In particular, as compared to the use of Hall sensors, the determination of current with the aid of the measurement of temperature is more robust and less vulnerable in surroundings involving electromagnetic compatibility (EMC). This may be the case in particular for an electrical circuit arrangement in which the at least one switching element has a clocked operation. Thanks to not having any current sensors to measure the phase currents, one can also avoid the unwanted influencing of the current measurement by faults attributable to the clocked switching operation of the switching elements, without having to install additional filter circuits for this.

Advantageously, the expense for the development of the electrical circuit arrangement is also reduced thanks to the use of methods according to embodiments of the present disclosure, since no integration of a current sensor connection has to be included in the installation of the electrical circuit arrangement. Furthermore, a testing of different types of current sensors and a calibration of the current sensors after manufacturing the electrical circuit arrangement will not be utilized.

In one embodiment, temperature measured values and voltage measured values are measured continuously by the temperature sensor and the voltage sensor and from these current values are determined continuously by the computing device. This has the advantage that the determination of the current can also be used, e.g., in a closed-loop or an open-loop control process of the electrical circuit arrangement.

In the case of a clocked switching element, the determination of the temperature measured values and voltage measured values can be done in particular such that at least one temperature measured value and at least one voltage measured value are ascertained for each On condition of the switching element. A determination of multiple temperature measured values and multiple voltage measured values within a single On condition when the switching element is turned on is also possible.

In one embodiment, an electrical circuit arrangement is used, which has multiple switching elements, each associated with a temperature sensor and a voltage sensor, wherein the computing device determines for each of the switching elements a current value of the current flowing respectively through the switchable portion.

In an electrical circuit arrangement including multiple switching elements, in particular to generate a multiphase output current, the switching elements can each be associated with their own temperature sensor and their own voltage sensor, so that the temperature and the voltage drop across the switchable portion can be determined individually for each of the switching elements. With the computing device, a current value of the current flowing through the switchable portion can be determined each time for the corresponding switching elements.

In one embodiment, an electrical circuit arrangement is used which is designed as a three-phase pulse inverter, wherein the computing device determines the three phase currents from the current values ascertained for at least two of the switching elements.

In a three-phase pulse inverter, it is basically sufficient to determine a phase current for two of the three phases, since the third phase current can generally be determined by computation, especially in the case of powering an electric machine. However, it is also possible for the three phase currents to each be measured, e.g., at the high-side transistors of the respective phases.

A measurement on all six switching elements of a three-phase pulse inverters is also possible. Advantageously, one can create redundancy in the determination of the current value in this way. This improves in particular the precision of the current determination, so that it can be used advantageously to control and/or regulate the electrical circuit arrangement and/or an electric machine connected to the electrical circuit arrangement.

In one embodiment, the current value is determined as a function of the magnitude of a control voltage imposed on the switching element in the On condition. Besides the temperature, the control voltage can also be used to determine the resistance, since the electrical resistance of the switchable portion can also depend on the imposed control voltage, for example, a gate-source voltage or a base-emitter voltage.

Thus, slight fluctuations in the control voltage can be taken into account in the determination of the electrical resistance of the switchable portion and thus the current. Also, a value mapping instruction such as a table or a computation instruction for the dependency of a control voltage imposed on the switching element in the On condition can be embedded in the computing device and be called upon when determining the current value.

In one embodiment, a computing device is used which is adapted to operate a driver circuit of the electrical circuit arrangement, in which the switching element is switched by the driver circuit, especially depending on the current value so determined. This allows the current measured values to be used directly for a closed-loop control of the electrical circuit arrangement or an electric machine connected to the electrical circuit arrangement. Furthermore, a computing device adapted to operate a driver circuit of the electrical circuit arrangement is already aware of the switching condition of the individual switching elements, so that the entire layout for implementing the method according to the present disclosure can be advantageously simplified.

In one embodiment, the temperature sensor and the voltage sensor are connected to at least one analog-digital converter and/or include an analog-digital converter, wherein the digitalized temperature measured value and the digitalized voltage measured value are relayed to the computing device, especially via a galvanically separating connection.

By using the analog-digital converter of a temperature sensor and/or a voltage sensor, an analog quantity put out by the temperature sensor or the voltage sensor such as an electrical voltage can be digitalized and thus be relayed in digital form to the computing device. For example, the temperature sensor may include a temperature sensor which is connected to an analog-digital converter. The voltage sensor may include an analog-digital converter connected at the input side to the switchable portion, or it may be designed as such, so that the voltage drop across the switchable portion is detected immediately and put out as a digital value. The analog-digital converters used can be, for example, sigma-delta converters.

The temperature sensor and the voltage sensor may also each include at least one preamplifier connected in front of the analog-digital converter, at least one filter and/or at least one integrator, or be connected to such components. In particular, a preamplifier, a filter and an integrator are placed at the analog side of the analog-digital converter, so that the correspondingly processed measurement signals of the temperature sensor and the voltage sensor can be relayed to the computing device.

A galvanically separating connection may be utilized in particular for a computing device which also actuates a driver circuit. By transmitting already digitalized measurement values of the temperature sensor and the voltage sensor, one can advantageously achieve a good fault resistance for the determination of the current value and thus also for the operation of the electrical circuit arrangement. For the transmission across the galvanically separating connection, the analog-digital converters can be connected to a transmitter unit, and corresponding receiver units will be provided at the computing device to receive the transmitted measurement values and relay them to the computing unit.

The analog-digital converters, as well as the other components present, the preamplifiers, filters, integrators and/or transmitter units, can be arranged on a driver board, which is connected to the computing device, in particular across the galvanic connection. Thus, the use of additional circuitry is not utilized. Advantageously, this achieves a compact layout and a very robust electrical circuit arrangement.

In one embodiment, a switching element is used which is integrated in a power supply module with at least a portion of the associated temperature sensor. The temperature sensor can be situated at least partly inside the power supply module and be associated with a switching element in switchable manner.

It is possible in particular for the power supply module to encompass multiple switching elements, forming a half-bridge for example, each of the switching elements being associated with a temperature sensor. In this way, an especially precise temperature determination of the switchable portion of the switching element is made possible. The temperature sensor can be contacted in particular by contacts located on a housing of the power supply module and be connected to the computing device.

In one embodiment, a temperature sensor is used which includes a temperature-dependent electrical resistance. The electrical resistance can be a resistance with a negative temperature coefficient (NTC resistance) or a resistance with a positive temperature coefficient (PTC resistance). This makes possible a robust temperature determination of the temperature of the switchable portion of the respective switching element. Moreover, when temperature-dependent electrical resistances are used, their integration in a power supply module including the switching element, i.e., the arrangement within the housing of the power supply module, is simplified.

In one embodiment, the switching elements which are used are metal oxide semiconductor field-effect transistors (MOSFETs), especially those based on silicon carbide. In the case of a switching element designed as a MOSFET, the switchable portion is accordingly the drain-source section of the transistor. In the activated condition, the electrical resistance of the drain-source section, also designated as $R_{DS,on}$, has a temperature-dependent electrical resistance, so that the electrical resistance can be determined through the temperature measurement, especially at a constant activation voltage or gate-source voltage of the transistor.

In one embodiment, an electrical circuit arrangement includes at least one switching element having a switchable portion, wherein the switching element is associated with a temperature sensor and a voltage sensor, wherein a temperature of the switching element can be measured by the temperature sensor and the voltage drop across the switchable portion of the switching element can be measured by the voltage sensor, wherein the temperature sensor and the voltage sensor are connected to a computing device and the computing device is adapted to carry out a method according to the present disclosure.

In one embodiment, a motor vehicle includes an electrical circuit arrangement according to the present disclosure.

The advantages and remarks described above in regard to according to embodiments of the present disclosure hold accordingly for the electrical circuit arrangement according to embodiments of the present disclosure and for the electrical motor vehicle according to the embodiments of the present disclosure. Conversely, the remarks for the electrical circuit arrangement and for the motor vehicle also hold accordingly for methods according to the embodiments of the present disclosure, and the remarks on the circuit arrangement also hold for the motor vehicle and vice versa.

BRIEF DESCRIPTION OF THE SEVERAL VIEWS OF THE DRAWINGS

Further advantages and details of the present disclosure will emerge from the following described embodiments as well as the drawings.

DETAILED DESCRIPTION

Figure 1:
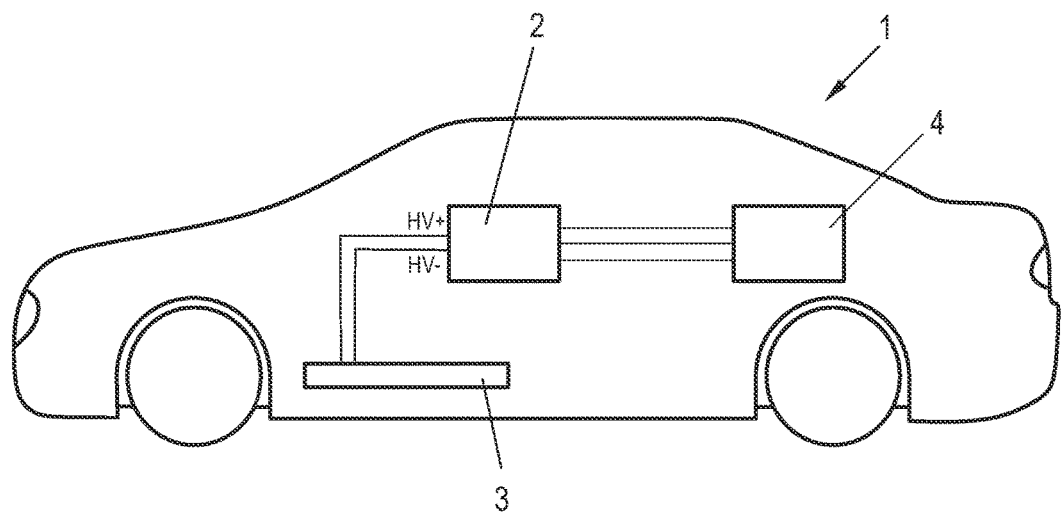
FIG. 1 is an illustration of a motor vehicle according to one embodiment.

FIG. 1 shows an embodiment of a motor vehicle 1 according to the present disclosure. The motor vehicle 1 includes an electrical circuit arrangement 2, which is designed as a three-phase traction inverter of the motor vehicle 1. The electrical circuit arrangement 2 transforms a direct current taken from a traction energy accumulator 3, such as a high-voltage battery, of the motor vehicle 1 into a three-phase alternating current, for example, for the operation of an electrical traction motor 4 of the motor vehicle 1.

Figure 2:
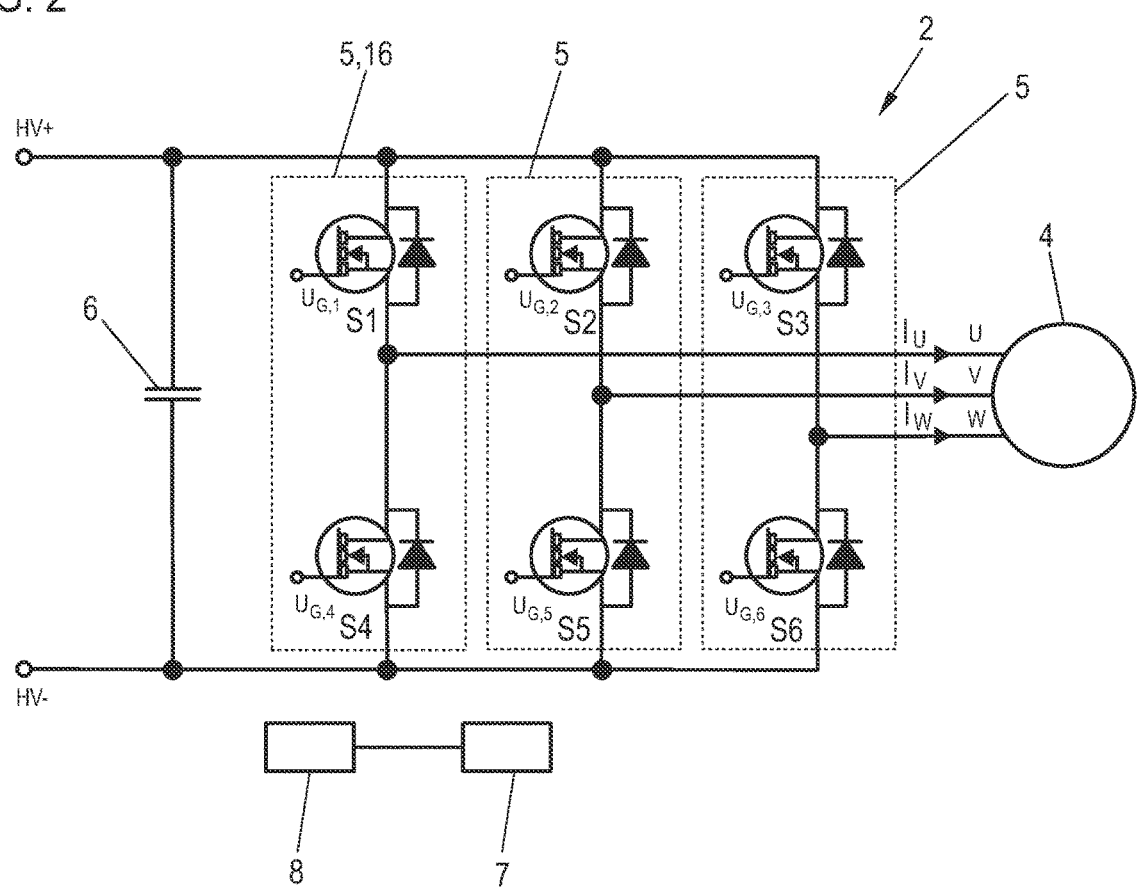
FIG. 2 a schematic diagram of a circuit arrangement according to one embodiment.

FIG. 2 shows an embodiment of the electrical circuit arrangement 2. The electrical circuit arrangement 2 is designed as a three-phase pulse inverter and includes six switching elements $S_1$-$S_6$. The switching elements $S_1$ and $S_4$, $S_2$ and $S_5$ and $S_3$ and $S_6$ each form a half-bridge, the switching elements $S_1$-$S_3$ each representing the high-side transistors and the switching elements $S_4$-$S_6$ accordingly the low-side transistors.

The terminals designated as HV+ and HV− at the direct current side of the electrical circuit arrangement 2 are connected for example to the traction energy accumulator 3 of the motor vehicle 1. Between these terminals is hooked up an intermediate circuit capacitor 6. The bridge points of the respective half-bridges 5 form phase terminals U, V and W for the connection of the electrical traction motor 4. Thanks to the electrical circuit arrangement 2, a direct current taken from the traction energy accumulator 3 can be transformed into a three-phase alternating current with the phase currents $I_U$, $I_V$ and $I_W$, in order to operate the electrical traction motor 4. Conversely, an alternating current generated by the traction motor 4 in a generator operation can be transformed into a direct current for the charging of the traction energy accumulator 3.

The electrical circuit arrangement 2 furthermore includes a computing device 7 as well as a driver circuit 8, the computing device 7 being adapted to operate the driver circuit 8. The driver circuit 8 serves for applying a control voltage or a gate-source voltage $U_{G1}$-$U_{G6}$ to the switching elements $S_1$-$S_6$. The connections between the driver circuit 8 and the control terminals of the switching elements $S_1$-$S_6$ are not shown, for reasons of clarity.

The switching elements $S_1$-$S_6$ are designed, e.g., as MOSFETs based on silicon carbide. The switching elements $S_1$-$S_6$ each include a switchable portion, across which a current flows when the switching element is turned on. The switchable portions of the switching elements $S_1$-$S_6$ are respectively the drain-source sections through which a load current flows when the corresponding switching element has been made conductive by the driver circuit 8, especially to generate the phase currents $I_U$, $I_V$ and/or $I_W$ in a clocked operation.

Figure 3:
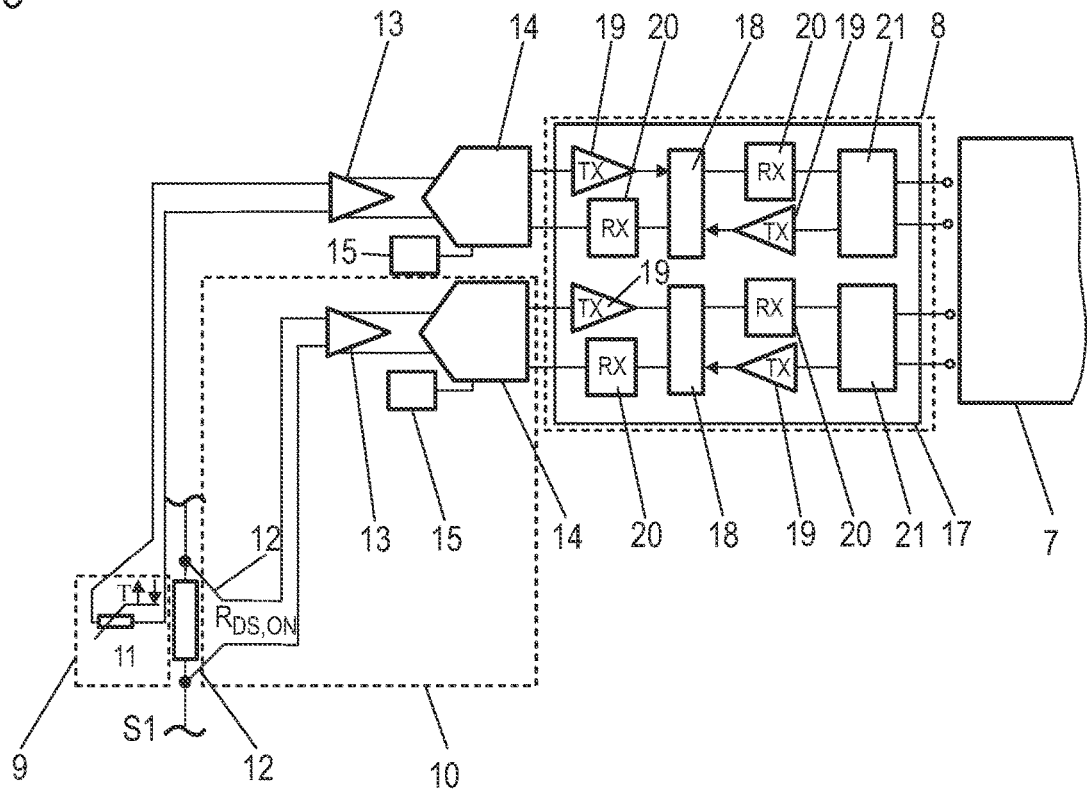
FIG. 3 is schematic diagram of an electrical circuit arrangement according to one embodiment.

As shown schematically in FIG. 3 for the switching element $S_1$, the switching element $S_1$ is associated with a temperature sensor 9 and a voltage sensor 10 of the electrical circuit arrangement 2. As an equivalent diagram for the switching element $S_1$, there is shown the electrical resistance of the switchable portion $R_{DS,on}$, also known as the channel resistance, which results in the activated condition of the switching element $S_1$. This switchable portion is associated with the temperature sensor 9, by which the temperature of the switchable portion or a junction temperature of the switching element can be measured. The temperature sensor 9 includes a temperature-dependent electrical resistance 11. This may be designed, for example, as a NTC resistance or as a PTC resistance.

The voltage sensor 10 can be connected to two contacts 12, which are arranged at the drain-source section of the switching element $S_1$, or it may include these contacts. The temperature sensor 9 is connected across a preamplifier 13 to an analog-digital converter 14, which in the present case is designed as a sigma-delta modulator. Furthermore, a reference voltage source 15 is also shown. The contacts 12 by which the voltage of the switchable portion, i.e., the drain-source voltage of the switching element $S_1$, can be picked off are likewise connected across a preamplifier 13 to an analog-digital converter 14. The amplifier 13 and the analog-digital converter 14 represent the voltage sensor 10 in this embodiment.

The preamplifiers 13, the analog-digital converters 14 and the reference voltage sources 15 may each be designed as part of the driver circuit 8 and be arranged, e.g., with the other elements of the driver circuit 8 on a common circuit board. The temperature sensor 9, especially the temperature-dependent resistance 11, is integrated with the switching element $S_1$ in a power supply module 16. The power supply module 16 may also include, in particular, the switching element $S_4$ and thus a complete half-bridge 5. In this case, the temperature sensor 9 associated with the switching element $S_4$, especially the temperature-dependent electrical resistance 11, can also be integrated in the power supply module 16.

The measurement values of the temperature sensor 9 and the voltage sensor 10, digitalized by the analog-digital converter 14, are relayed by a galvanically separating connection 17 to the computing device 9. The galvanically separating connection 17 includes at least one insulating means 18, as well as multiple transmitters 19 and receivers 20 for relaying the digitalized measurement values of the temperature sensor 9 and the voltage sensor 10. Furthermore, interfaces 21 are provided for connecting the computing device 9 to the galvanically separating connection 17 and thus to the temperature sensor 9 and the voltage sensor 10.

The components represented in FIG. 3 for the switching element $S_1$ are present in particular for each of the switching elements $S_1$-$S_6$ of the electrical circuit arrangement 2, so that also for the switching elements $S_2$-$S_6$ there are present and correspondingly arranged a temperature sensor 9, a voltage sensor 10, and the components 13-15 and 19-21 utilized for the evaluation and transmission of the measurement values to the computing device 9.

Figure 4:
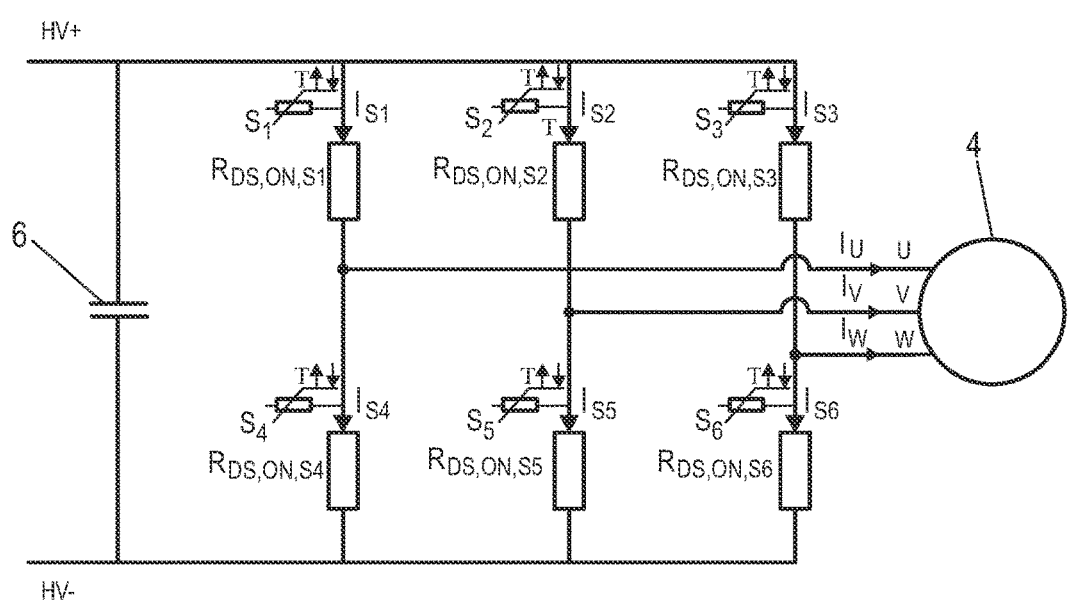
FIG. 4 is a schematic diagram of a circuit arrangement according to a method according to one embodiment.

FIG. 4 shows a schematic equivalent diagram of the electrical circuit arrangement 2 to explain an embodiment of a method for determination of a current flowing through at least one of the switching elements $S_1$-$S_6$ of the electrical circuit arrangement 2. The method can be carried out by the computing device 7 which, as shown in FIG. 3, is connected respectively to a temperature sensor 9 and a voltage sensor 10 of the switching elements $S_1$-$S_6$.

Schematically represented in the equivalent diagram are the respective resistances $R_{DS,on,S1}$-$R_{DS,on,S6}$. Each of these represents the temperature-dependent electrical resistance of the switchable drain-source sections of the switching elements $S_1$-$S_6$. The temperature sensor 9 respectively measure a temperature of the respectively associated switching element $S_1$-$S_6$. With the voltage sensor 10, the voltage drop across the switchable portion of the switching elements $S_1$-$S_6$ is measured accordingly. The computing device ascertains a current value of the respective currents $I_{S1}$-$I_{S6}$. To determine the current $I_{S1}$, the temperature measured value of the temperature sensor 9 of the switching element $S_1$ and the voltage measured value of the voltage sensor 10 of the switching element $S_1$ are used. The other load currents can be determined accordingly by the temperature sensor 9 and voltage sensor 10 which are associated with the other switching elements $S_2$ to $S_5$.

Temperature measured values and voltage measured values are measured continuously by the temperature sensor 9 and the voltage sensor 10, and from these the computing device continuously determines current measurement values. For example, from the temperature measured values the computing device 7 can determine a resistance value of the temperature-dependent channel resistance $R_{DS,on}$, in dependence on a value mapping instruction which is embedded for example in the computing device 7. This value mapping instruction may be, for example, a computation instruction or an embedded table. In addition, it is possible for the computing device 7 to also take into account measured values of the respective control voltages $U_{G1}$-$U_{G6}$, since the control voltage may also have an impact on the magnitude of the resistance $R_{DS,on}$ especially in the case of a silicon carbide MOSFET.

Due to measuring all the currents $I_{S1}$-$I_{S6}$ through the switching elements $S_1$-$S_6$, a redundancy can be created, which can advantageously influence the precision of the current measurement and/or the robustness of the electrical circuit arrangement. From the current values $I_{S1}$-$I_{S6}$ so determined, the phase currents $I_U$, $I_V$ and $I_W$ can be determined. These correspond to at least one of the determined current values of the currents $I_{S1}$-$I_{S6}$, depending on the switching condition of the switching elements $S_1$, so that they can be calculated from the latter.

Alternatively, it is also possible to not provide a temperature sensor 9 and/or a voltage sensor 10 at all switching elements $S_1$-$S_6$ and thus not determine a current value for each of the switching elements. For example, a current value can be determined only for the high-side transistors $S_1$-$S_3$. It is also possible to determine a current value for only two of the high-side transistors $S_1$-$S_3$. For example, in this case a remaining third current value for one of the phase currents $I_U$, $I_V$ or $I_W$ can be calculated from the two ascertained current values, for example when there is a star or triangle circuit for the phases U, V, W in the electric machine 4.

A method according to one embodiment, advantageously makes it possible to do away with additional current sensors for measuring the phase currents $I_U$, $I_V$ and $I_W$. In this way, the circuit arrangement 2 can be produced more economically, smaller and more efficient. Furthermore, the robustness of the electrical circuit arrangement 2 is enhanced, since fewer elements or power connections are provided. Furthermore, the overall layout of the electrical circuit arrangement 2 is simplified by the integration of part of the measurement means and/or the galvanically separating connection 17 in the driver circuit 8. This in particular also makes it easier to install the electrical circuit arrangement 2 in the motor vehicle 1.

The driver circuit 8 for example can be arranged with the inverter, formed from the three half-bridges 5, in a common housing. The computing device 7 can also be arranged inside this housing, or it can be placed in a different position and be connected to the driver device 8 and the temperature sensor 9 and the voltage sensor 10 of the switching elements $S_1$-$S_6$.

The computing device 9 can operate the driver circuit 8 in dependence on the ascertained current values. In particular, the computing device 9 can operate the driver circuit 8 and thus also the switching elements $S_1$-$S_6$ in dependence on phase currents $I_U$, $I_V$ and $I_W$ as determined from the current values $I_{S1}$-$I_{S6}$, preferably as part of a current regulation of the three-phase motor current for the traction motor 4. For this, the computing device may be connected, for example, to a rotor position sensor (not shown) of the traction motor 4 and/or to a data communication link (not shown), by which rotor position information or a torque setting or the like can be received.

Due to the robust and compact layout of the electrical circuit arrangement 2, a cooling of the electrical circuit arrangement 2 is also facilitated, for example, by connection to a cooling device (not shown) of the motor vehicle 1. Advantageously, the fault vulnerability of the measurement can be significantly reduced by the integration of the entire measurement chain composed of the temperature sensor 9 and the voltage sensor 10 in the driver circuit 8. Due to the analog-digital converters 14 designed as sigma-delta converters, a digital output signal is advantageously produced, which can minimize the fault vulnerability.

In one embodiment, a method can also be used in a two-phase inverter or an inverter designed with more than three phases for generating an alternating current. The preceding remarks on the electrical circuit arrangement 2 designed as a three-phase inverter will apply accordingly.

Patent Application No. 102021113493.5, filed in Germany on May 26, 2021, to which this application claims priority, is hereby incorporated by reference in its entirety.

Aspects and features of the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
turning on a switching element of an electrical circuit arrangement;
flowing a current through a switchable portion of the switching element;
measuring a temperature of the switching element with a temperature sensor that is adjacent to the switchable portion of the switching element, wherein the temperature sensor includes a temperature-dependent electrical resistance and is connected to a computing device;
measuring a voltage drop across the switchable portion of the switching element with a voltage sensor connected to the computing device;
obtaining a digital temperature value by digitalizing the temperature of the switching element measured by the temperature sensor;
obtaining a digital voltage value by digitalizing the voltage drop measured by the voltage sensor;
relaying the digital temperature value and the digital voltage value to the computing device across a galvanically separating connection; and
determining a current value of the current with the computing device based on the temperature measured by the temperature sensor and based on the voltage drop measured by the voltage sensor.

2. The method according to claim 1, comprising:
measuring the temperature continuously with the temperature sensor;
measuring the voltage drop continuously with the voltage sensor; and
continuously determining the current value with the computing device based on the continuously measured temperature and the continuously measured voltage drop.

3. The method according to claim 1, wherein the electrical circuit arrangement includes multiple switching elements each associated with a respective temperature sensor and a respective voltage sensor, wherein the computing device determines for each of the switching elements a respective current value of the current flowing respectively through the switchable portion.

4. The method according to claim 3, wherein the electrical circuit arrangement is a three-phase pulse inverter, wherein the computing device determines three phase currents from current values ascertained for at least two of the switching elements.

5. The method according to claim 1, wherein the current value is determined as a function of a magnitude of a control voltage imposed on the switching element in an On condition.

6. The method according to claim 1, wherein the computing device is adapted to operate a driver circuit of the electrical circuit arrangement, in which the switching element is switched by the driver circuit based on the current value.

7. The method according to claim 1, wherein the temperature sensor and the voltage sensor are connected to at least one analog-to-digital converter that generates the digital temperature value and the digital voltage value.

8. The method according to claim 7, wherein the temperature sensor is connected across a preamplifier to the at least one analog-to-digital converter.

9. The method according to claim 1, wherein the switching element is integrated in a power supply module with at least a portion of the temperature sensor.

10. The method according to claim 1, wherein the switching element is a metal oxide semiconductor field-effect transistor based on silicon carbide.

11. An electrical circuit arrangement, comprising:
a switching element having a switchable portion;
a temperature sensor, adjacent to the switchable portion of the switching element, wherein the temperature sensor, in operation, measures a temperature of the switching element;
a voltage sensor that, in operation, measures a voltage drop across the switchable portion;
at least one analog-to-digital converter connected to the temperature sensor and the voltage sensor, wherein the at least one analog-to-digital converter, in operation, obtains a digital temperature value by digitalizing the temperature of the switching element measured by the temperature sensor and obtains a digital voltage value by digitalizing the voltage drop measured by the voltage sensor; and
a computing device connected to the temperature sensor and the voltage sensor, wherein the computing device, in operation, measures a current flowing through the switching element based on the temperature measured by the temperature sensor and based on the voltage drop measured by the voltage sensor,
wherein the at least one analog-to-digital converter and the computing device are connected by a galvanically separating connection, and
wherein the digital temperature value and the digital voltage value are relayed to the computing device across the galvanically separating connection.

12. A motor vehicle comprising an electrical circuit arrangement, the electrical circuit arrangement including:
a switching element having a switchable portion;
a temperature sensor adjacent to the switchable portion of the switching element, wherein the temperature sensor, in operation, measures a temperature of the switching element;
a voltage sensor that, in operation, measures a voltage drop across the switchable portion;
at least one analog-to-digital converter connected to the temperature sensor and the voltage sensor, wherein the at least one analog-to-digital converter, in operation, obtains a digital temperature value by digitalizing the temperature of the switching element measured by the temperature sensor and obtains a digital voltage value by digitalizing the voltage drop measured by the voltage sensor; and
a computing device connected to the temperature sensor and the voltage sensor, wherein the computing device, in operation, measures a current flowing through the switching element based on the temperature measured by the temperature sensor and based on the voltage drop measured by the voltage sensor,
wherein the at least one analog-to-digital converter and the computing device are connected by a galvanically separating connection, and
wherein the digital temperature value and the digital voltage value are relayed to the computing device across the galvanically separating connection.

* * * * *